United States Patent [19]

Aoki et al.

[11] Patent Number: 4,864,382
[45] Date of Patent: Sep. 5, 1989

[54] SEMICONDUCTOR DEVICE

[75] Inventors: Masaaki Aoki, Minato; Kazuo Yano, Kokubunji; Toshiaki Masuhara, Nishitama, all of Japan

[73] Assignee: Hitachi, Ltd., Tokyo, Japan

[21] Appl. No.: 148,052

[22] Filed: Jan. 25, 1988

[30] Foreign Application Priority Data

Jan. 30, 1987 [JP] Japan ................... 62-18389

[51] Int. Cl.[4] .............. H01L 29/167; H01L 29/207; H01L 29/78
[52] U.S. Cl. ........................... 357/64; 357/63; 357/23.6
[58] Field of Search ............. 357/23.6, 63, 64

[56] References Cited

U.S. PATENT DOCUMENTS 4,424,526 1/1984 Dennard et al. ............. 357/23.6
4,649,408 3/1987 Sekine et al. ................. 357/63

FOREIGN PATENT DOCUMENTS 162258 12/1980 Japan ................... 357/23.6

OTHER PUBLICATIONS

Brack et al. "Prevention of Alpha-Particle Induced Fails in Dynamic Memories" IBM Technical Disclosure Bulletin, vol. 22, No. 9, Feb. 1980, p. 4106.

Primary Examiner—Rolf Hille
Assistant Examiner—Robert P. Limanek
Attorney, Agent, or Firm—Kenyon & Kenyon

[57] ABSTRACT

A MOS memory is formed in a semiconductor bulk, whereas a barrier semiconductor layer is disposed at the boundary between a MOS memory portion and the semiconductor bulk in order to reduce the effect of undesirable carriers excited by α-particles. The barrier semiconductor layer is designed to permit operation of the memory at low temperature while reducing the incidence of soft errors due to α-particles.

18 Claims, 4 Drawing Sheets

SEMICONDUCTOR DEVICE

BACKGROUND OF THE INVENTION

1. Field of the Invention: o The present invention relates to an anti α-particle structure for a semiconductor device, for example, a low temperature operation MOS memory. More particularly, the present invention pertains to a low temperature operation memory structure having a reduced collection efficiency at which undesirable electrons (or holes) excited by α-particles are collected in memory nodes.

2. Description of the Prior Art:

Occurrence of soft errors which are caused by α-particles is one of the critical problems concerning the reliability of semiconductor memories. More specifically, a-particles emitted by radioactive elements (U-238, Th-230, etc.) in memory element packaging materials generate noise charges in the element which may destroy the storage information, resulting in a mal-operation.

A typical conventional anti α-particle device structure for memory elements is disclosed in Japanese Patent Laid-Open Nos. 59-84461 (1984), 59-94451 (1984) and a literature entitled "A P-Type Buried Layer for Protection Against Soft Errors in High Density CMOS Static RAMs", H. Momose et al., IEEE IEDM, Technical Digest, pp. 706-709, 1984. In this prior art, a p+ layer is formed under a memory node (n+ impurity layer) to thereby prevent noise charges from flowing into the memory node. A conventional device structure for MOS static memory is shown in FIG. 2. In the figure, the reference numeral 21 denotes an n-type Si substrate, 22 a p-type well, 23 an n+ impurity layer which defines a memory node in which the information charge of a memory cell is accumulated, 24 a gate electrode (transfer MOS electrode which is connected to a word line) of a MOS transistor, 25 an n+ impurity layer which is connected to a data line, and 26 a p+ impurity layer which is formed under the memory node. When α-particles are applied to the memory cell from the upper side thereof, electrons 27 and holes 28 are generated along the track 29. When the memory node is at a high voltage level, the generated electrons flow into the n+ impurity layer which defines the memory node 23 and lowers the voltage level of the node, thus causing a mal-operation (soft error). According to the illustrated device structure, it is possible to effectively prevent the above-described noise electrons 27 from flowing into the memory node 23 by means of the potential barrier which is formed at the boundary between the p+-layer 26 and the p-layer 22. Assuming that the impurity concentration difference between the p+-layer 26 and p-layer 22 is $10^2$ cm$^{-3}$ or more, a potential barrier of 0.1 eV or more is present at the boundary between the layers under room temperature conditions, and it is therefore possible to effectively prevent the noise electrons 27 from flowing into the memory node 23.

SUMMARY OF THE INVENTION

The conventional memory structure shown in FIG. 2 is considerably effective as an anti α-particle structure under room temperature conditions. However, the examination made by the inventors of this application have clarified that, when the device having this memory structure is cooled down to 100° K. or less, the potential barrier between the p+-layer 26 and the p-layer 22 lowers considerably, so that it is impossible to prevent noise electrons generated by α-particles from flowing into the memory node. More specifically, when a MOS memory is held at low temperature, it is advantageously possible to store the information charge accumulated in the diffusion capacitance of the memory node for a considerably long time without leakage (i.e., $5\times10^5$ seconds at 220° K., and 10 years at 170° K.), but it is impossible with the above-described conventional device structure to prevent occurrence of soft errors due to α-particles at such low temperature.

The following may be considered to be reasons why a potential barrier is present at the boundary between the p+-layer 26 and p-layer 22 at room temperature but it lowers at low temperature, i.e., 100° K. or less.

The Fermi level of a p-type semiconductor having a p-type impurity (acceptor) such as B, Al, Ga, In or the like added to, for example, Si, is present between the intrinsic Fermi level and the valence band at room temperature. When the concentration of the p-type impurity is relatively low, the Fermi level is closer to the intrinsic Fermi level, whereas, when the p-type impurity concentration is relatively high, the Fermi level is closer to the valence band. For this reason, it is possible at room temperature to ensure a potential barrier between the p+- and p-layers 26, 22 which is required to prevent occurrence of a soft error due to α-particles.

However, the Fermi level of the p-type semiconductor is closer to the valence band at low temperature, i.e., 100° K. or less, irrespective of the level of impurity concentration, and therefore the potential barrier between the p+- and p-layers 26, 22 lowers considerably. The above-described temperature dependencies of the Fermi level of a P-type semiconductor and an N-type semiconductor may be understood from, for example, FIG. 18 at page 37 of S. M. Sze, "Physics of Semiconductor Devices", 1969.

More specifically, the Fermi level of a P-type semiconductor settles down at a substantially intermediate value between the acceptor level and the valence band (Ev) at T=100° K. or less. The Fermi level of a p+-layer having a relatively large amount of impurity doped therein also settles down at the above-described intermediate value at low temperature, which results in the potential barrier between the p+- and p-layers lowering considerably. Accordingly, the p+-layer in the conventional device structure loses its effectiveness in serving as an anti α-particle barrier at low temperature.

The present invention has been accomplished on the basis of the results of the above-described examination, and it is therefore a primary object of the present invention to provide a MOS memory structure for low temperature operation which is so designed that the above-described problems of the prior art are overcome and the occurrence of soft errors due to α-particles is effectively prevented.

The above and other objects and novel features of the present invention will become clear from the following description.

In a first embodiment of the present invention, a p-layer compensated by an n-type impurity is employed in place of the p+-layer which is provided under the memory node shown in FIG. 2. In a second embodiment of the present invention, a p-layer having a shallower impurity level than that of the substrate is employed in place of the p+-layer in the conventional memory structure.

The Fermi level of the p-type semiconductor layer compensated by an n-type impurity which is employed in the first embodiment of the present invention is not closer to the valence band but near the acceptor level at low temperature, i.e. 100° K. or less. On the other hand, the Fermi level of a p-type semiconductor which is not substantially compensated by an n-type impurity or that of a p-type semiconductor having an extremely low n-type impurity concentration is at a substantially intermediate value between the acceptor level and the valence band at low temperature, i.e., 100° K. or less. Accordingly, a potential barrier is ensured between the former p-type semiconductor and the latter p-type semiconductor even at 100° K. or less.

The Fermi level of the p-type semiconductor layer having a relatively shallow acceptor level which is employed in the second embodiment of the present invention is at a substantially intermediate value between the shallow acceptor level and the valance band at low temperature, i.e., 100° K. or less. On the other hand, the Fermi level of a p-type semiconductor layer having a relatively deep acceptor level is substantially intermediate between the deep acceptor level and the valence band at low temperature, i.e., 100° K. or less. Accordingly, the acceptor level difference enables a potential barrier to be ensured between the former p-type semiconductor and the latter p-type semiconductor even at 100° K. or less.

DESCRIPTION OF THE PREFERRED EMBODIMENTS

Figure 1:
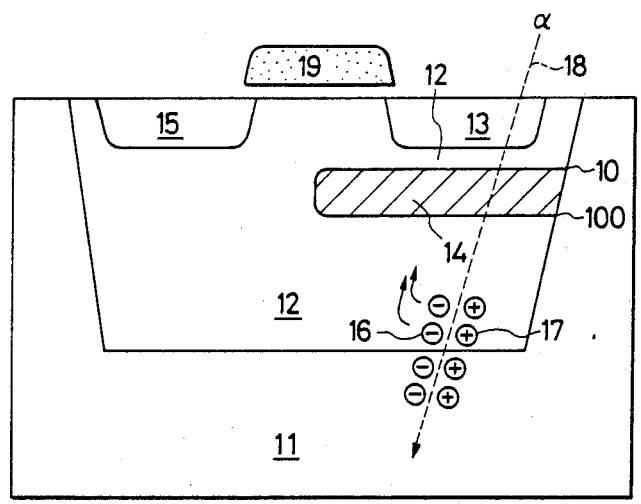
FIG. 1 is a sectional view of a semiconductor device according to one embodiment of the present invention.
Figure 2:
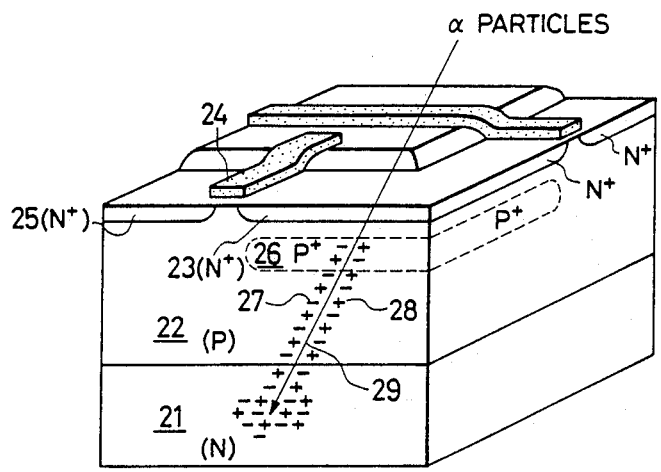
FIG. 2 is a sectional view of a semiconductor device which has heretofore been known.

A first embodiment of the present invention will be described hereinunder. FIG. 1 shows a MOS static memory according to the first embodiment of the present invention. In the figure, the reference numeral 11 denotes an n-type Si substrate, 12 a p-type well, 13 an n+ impurity layer which defines a memory node in which the information charge of a memory cell is accumulated, 19 a transfer MOS gate electrode (word line) of the memory cell, 15 an n+ impurity layer which is connected to a data line, and 14 a p-layer partially compensated by an n-type impurity (donor) which is formed under the memory node.

Figure 3:
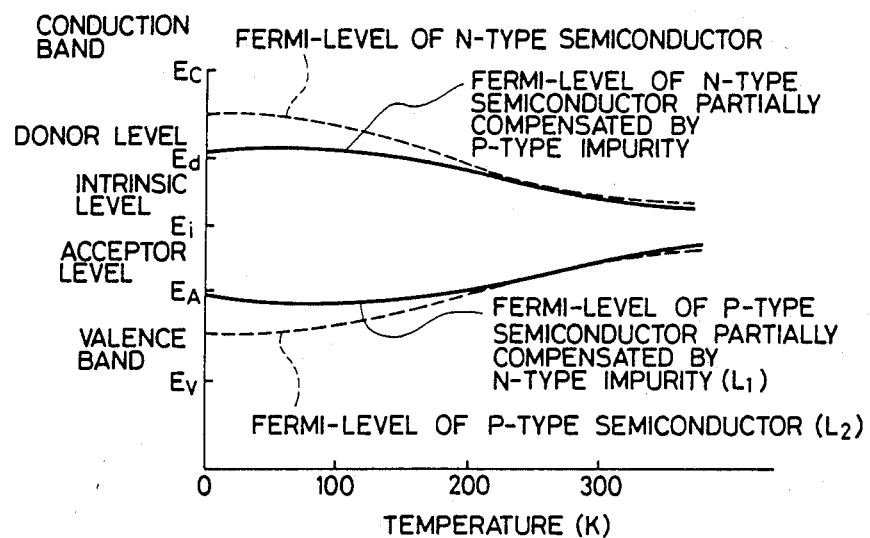
FIG. 3 is a graph showing the temperature dependencies of the Fermi level of p- and n-type semiconductors.

The Fermi level of the p-type semiconductor layer 14 compensated by an n-type impurity is near the acceptor level $E_A$ at low temperature, i.e., 100° K. or less, as shown by the solid line $L_1$ in FIG. 3. The technical definition of the p-type semiconductor layer compensated by an n-type impurity is such that, as is well known in the semiconductor field, the relationship between the acceptor concentration $N_a$ and the donor concentration $N_D$ in the semiconductor layer satisfies the condition of $N_A > N_D$ and P- and N-type impurities cancel each other but the semiconductor layer has P-type electrical characteristics even after the cancellation.

On the other hand, the p-type well 12 is either a p-type semiconductor layer which is not substantially compensated by an n-type impurity or a p-type semiconductor layer having an extremely low n-type impurity concentration. The Fermi level of such a p-type semiconductor is, as is well known, at a substantially intermediate value between the acceptor level $E_A$ and the valence band $E_V$ at low temperature, i.e., 100° K. or less, (see the chain line $L_2$ in FIG. 3). In contrast, in a p-type semiconductor layer compensated by an n-type impurity, the greater part of electrons from a donor are trapped at the acceptor level at low temperature, i.e., 100° K. or less, so that the Fermi level of such a compensated p-type semiconductor layer is near the acceptor level $E_A$ at low temperature as shown by the solid line $L_1$ in FIG. 3. The temperature dependencies of the Fermi level of an uncompensated or compensated semiconductor such as those described above are reported in S. K. Tewksbury "Solid-State Electronics" Vol. 28 No. 3, pp. 255–276, 1985.

Figure 4:
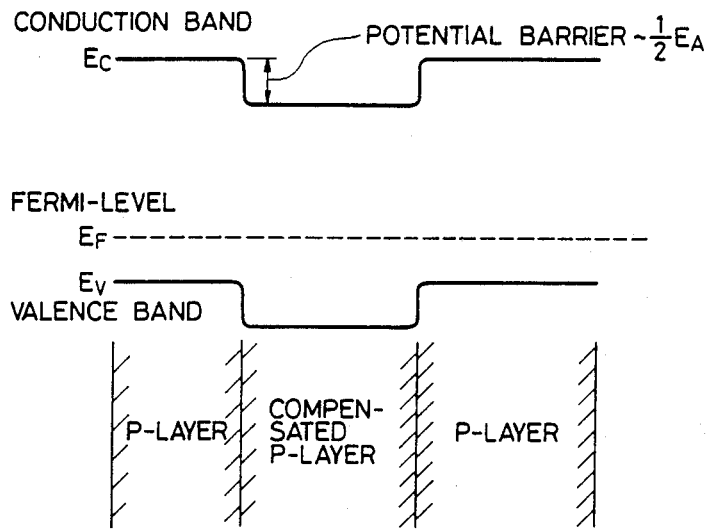
FIGS. 4 and 5 are views each showing a potential barrier which is formed in a semiconductor device according to the embodiment of the present invention.

Accordingly, a potential barrier of about $E_A/2$ is ensured between the p-type semiconductor layer 14 compensated by an n-type impurity and the p-type well 12 containing substantially no donor even at low temperature, i.e., 100° K. or less, as shown in FIG. 4, and the potential barrier serves as an effective barrier against electrons generated by $\alpha$-particles.

Figure 6:
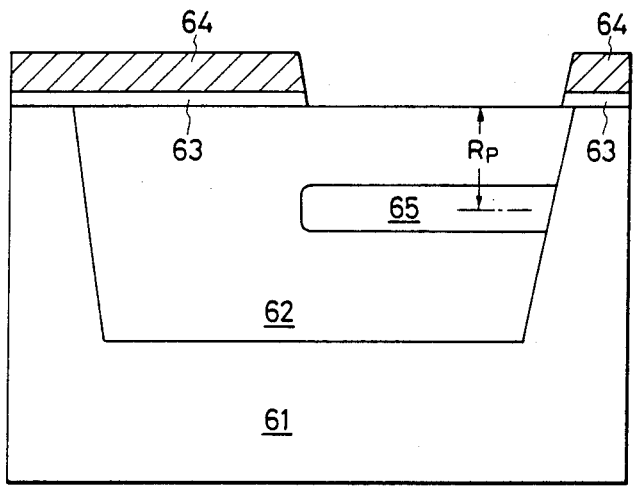
FIG. 6 is a sectional view of a semiconductor substrate in the process of manufacturing a semiconductor device according to the embodiment of the present invention.

The process for producing the semiconductor device according to this embodiment will next be explained with reference to FIG. 6.

First, a p-well 62 is formed by thermal diffusion or ion implantation (the surface impurity concentration: $10^{16}$ cm$^{-3}$), and a SiO$_2$ layer 63 and a photoresist layer 64 are then deposited on the Si surface. After a window is opened in a desired region, an n-type impurity such as As (arsenic), P (phosphorus) or the like is implanted using a high energy through the window to form a p-layer 65 containing a donor. The reference numeral 61 denotes an n-type Si substrate having an extremely low impurity concentration. When As is employed as a donor, if the implantation energy is assumed to be from 500 to 900 KeV, the donor is implanted in the p-layer within a region which has a depth Rp of from 0.3 to 0.5 $\mu$m and a layer thickness of 0.1 $\mu$m or more. When P is employed as a donor, if the implantation energy is assumed to be from 240 to 400 KeV, the donor is implanted in the p-layer within a region which has a depth Rp of from 0.3 to 0.5 $\mu$m and a layer thickness of 0.1 $\mu$m or more. However, the donor concentration in the p-layer concerned is set so as to be 90% of the acceptor concentration. After the ion implantation, the Si surface is irradiated with a laser beam to recover the crystallizability of the Si surface layer with the dose distribution maintained at a constant level (laser annealing). If a ruby laser beam of 1000 MW is applied, it is possible to recover the crystallizability of a region which is from 0.3 to 0.5 $\mu$m deep from the surface.

At the boundary 10 between the p-layer (denoted by 14 in FIG. 1) formed as described above and the p-well 12, a potential barrier of about 23 meV is formed as shown in FIG. 4. Since at low temperature, i.e., 100° K. or less, the heat energy (kT) of electrons excited in the p-well 12 is 8.5 meV or less, it is possible to effectively prevent noise electrons 16 generated as a result of irradiation with α-particles from flowing into the memory node 13.

Since the interface 10 between the p-well 12 and the p-layer 14 is formed at a depth of 0.5 μm from the Si surface and the range of α-particles is about 20 μm, only 1/40 of the noise electrons generated by the α-particles are collected in the memory node 13 (in the case of vertical incidence). In other words, it is possible according to the present invention to reduce the amount of noise charges flowing into the memory node to 1/40. By virtue of this advantageous effect, the incidence of soft errors in the MOS static RAM having the device structure according to the present invention becomes two or more orders in magnitude smaller than in the case of the conventional device structure.

A second embodiment of the present invention will next be described with reference to FIG. 1. This embodiment is the same as the first embodiment except that in the second embodiment a p-type impurity which has a relatively deep acceptor impurity level is introduced into the p-type well 12 and a p-type impurity which has a relatively shallow acceptor impurity level is introduced into the p-type semiconductor layer 14.

The p-type well 12 and the p-type semiconductor layer 14 have an extremely low n-type impurity concentration; therefore they are not substantially compensated by a n-type impurity.

Accordingly, the Fermi level of the p-type well 12 having a deep acceptor impurity level $E_A$ is substantially intermediate between the deep acceptor level $E_A$ and the valence band at low temperature, i.e., 100° K. or less. On the other hand, the Fermi level of the p-type semiconductor layer having the shallow acceptor impurity level $E_A'$ is substantially intermediate between the shallow acceptor level and the valence band at low temperature, i.e., 100° K. or less. Accordingly, even at 100° K. or less, the difference between the two acceptor levels enables a potential barrier of $\frac{1}{2}(E_A-E_A')$ to be ensured between the p-type well 12 and the p-type semiconductor layer 14 (see FIG. 5).

In the case where the acceptor impurity concentration in the p-type well 12 is low and the acceptor impurity concentration in the p-type semiconductor layer 14 is high, a potential barrier is ensured between the p-type well 12 and the p-type semiconductor layer 14 even at a temperature of 100° K. or more in the same way as in the prior art.

In (indium) may be employed as an acceptor having the deep acceptor level $E_A$ for the p-type well 12, and B (boron) may be employed as an acceptor having the shallow acceptor level $E_A'$ for the p-type semiconductor layer 14.

The process for producing the semiconductor device according to the second embodiment will next be explained with reference to FIG. 6.

In the same way as in the embodiment which has been already described, the p-well 62 is formed in such a manner that In is implanted with the $SiO_2$ film 63 and the resist layer 64 employed as a mask and annealing is then carried out for 30 minutes in the nitrogen gas at 900° C. Thereafter, boron or $BF_2$ is implanted using a high energy to form the p-layer 65. When boron is employed as an acceptor, if the implantation energy is assumed to be from 100 to 190 KeV, the p-layer 65 is formed within a region which has a depth Rp of from 0.3 to 0.5 μm and a layer thickness of 0.07 μm or more.

The boron concentration in the p-layer 65 is set so as to be one order in magnitude higher than the above-described In concentration. Irradiation with a ruby laser beam of 1000 MW enables recovery of the crystallizability of the region which is from 0.3 to 0.5 μm deep from the surface in the same way as in the first embodiment.

Figure 5:
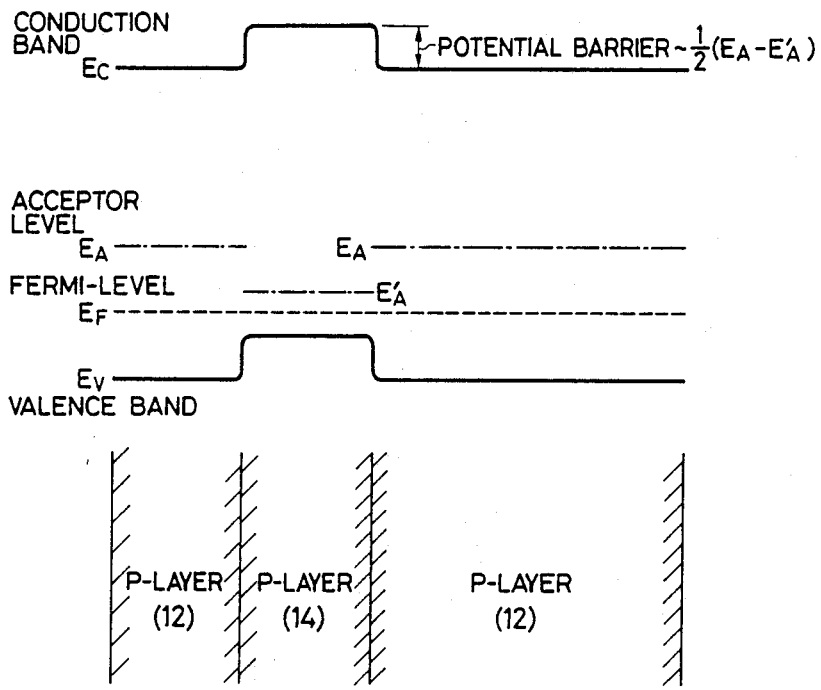

At the boundary 100 between the p-layer (denoted by 14 in FIG. 1) formed as described above and the p-well 12, a potential barrier of about 50 meV is formed as shown in FIG. 5. Since at low temperature, i.e., 100° K. or less, the heat energy of electrons excited in the p-well 12 is 8.5 meV or less, it is possible with this barrier to effectively prevent the excited electrons from flowing into the memory node 13. Since the interface 100 between the p-well 12 and the p-layer 14 is formed at a depth of 0.5 μm from the Si surface and the range of α-particles is about 20 μm, only 1/40 of noise charges generated by α-particles are collected in the memory node 13 (in the case of vertical incidence). In other words, it is possible according to the present invention to reduce the amount of noise charges flowing into the memory node to 1/40. The incidence of soft errors in this memory structure was measured and found to be two or more orders in magnitude smaller than in the case of the conventional memory structure.

A third embodiment of the present invention will be described hereinunder with reference to FIG. 1. The third embodiment differs from the second embodiment in the contents of the p-type well 12 and the p-layer 14. In this embodiment, boron is implanted into the p-well 12 as in the conventional practice, and an element which has a relatively deep impurity level, for example, In, is implanted into the p-layer 14 which serves as a barrier. At this time, the In concentration is set so as to be one or more order in magnitude higher than the boron concentration. As a result, at the boundary 10 between the p-well 12 and the p-layer 14, a potential barrier of about $\frac{1}{2}(E_A-E_A')$ ($E_A$: the acceptor level in the p-layer 14; $E_A'$: the acceptor level in the p-well 12) is formed in the same way as in the second embodiment, so that it is possible to effectively prevent noise electrons from flowing into the memory node. The effects of this embodiment are similar to those in the case of the first and second embodiments.

Figure 7:
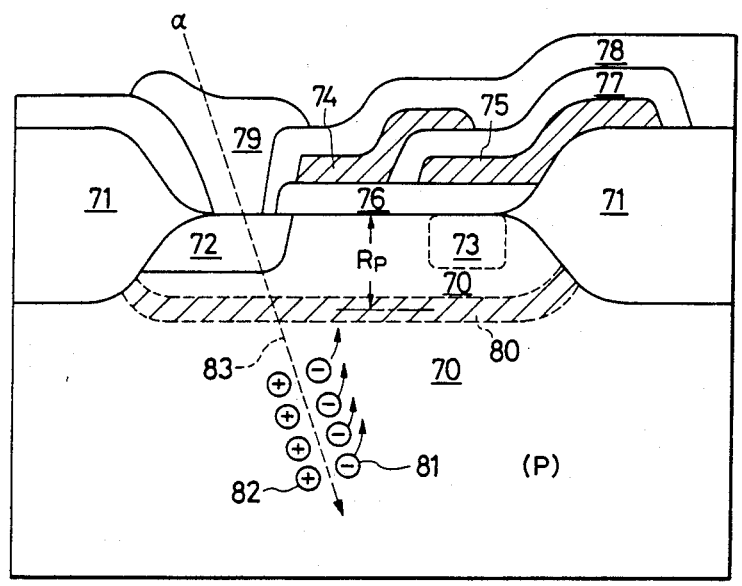
FIG. 7 is a sectional view of a semiconductor device according to another embodiment of the present invention.

A fourth embodiment of the present invention will next be described with reference to FIG. 7. In the fourth embodiment, the present invention is applied to a memory cell of a dynamic MOSRAM. In FIG. 7, the reference numeral 70 denotes a p-type Si substrate, 71 a field oxide film, 72 an n+ impurity layer which is connected to a data line, 73 a memory cell charge accumulation portion, 74 a transfer MOS gate electrode, 75 an accumulation gate electrode, 76 a gate oxide film, 77 a $SiO_2$ film, 78 a PSG (phosphosilicate glass) film, 79 an Al electrode, and 80 a p-layer which is partially compensated by an n-type impurity. The p-layer 80 is formed so as to surround the n+ impurity layer 72 serving as a data line and the memory cell charge accumulation portion 73, as shown in FIG. 7. This structure is formed in the following manner.

A field oxide film 71 is formed on a p-type Si substrate 70 by the known LOCOS (Local Oxidation of Silicon) method, and a gate oxide film 76 is then formed. Thereafter, a donor As is implanted using an energy of from 500 to 900 KeV. Thus, an As-containing p-layer 80 is formed within a region which is from 0.3 to 0.5 μm deep from the Si surface and which has a layer thickness of 0.1 μm or more. The As concentration is set so as to be 90% or less of the concentration in the p-type substrate. When phosphorous is employed as a donor, if the implantation energy is assumed to be from 240 to 400 KeV, a p-layer 80 which contains phosphorus (P) is similarly formed within a region which is from 0.3 to 0.5 μm deep from the Si surface and which has a layer thickness of 0.1 μm or more. The phosphorus concentration is set so as to be 90% or less of the concentration in the p-type substrate. Near the field oxide film 71, the p-layer 80 approaches the Si surface while curving because of the presence of the field oxide film 71. As a result, the p-layer 80 is formed so as to surround the data line 72 and the memory cell charge accumulation portion 73, as illustrated. After the abovedescribed ion implantation, the Si surface is irradiated with a laser beam to recover the crystallizability of the Si surface layer with the dose distribution maintained at a constant level (laser annealing). Thereafter, a memory cell of a MOSRAM is formed in accordance with the ordinary process.

At the boundary between the As-containing p-layer 80 formed as described above and the p-substrate 70, a potential barrier of about 23 meV is present as described above.

Since at low temperature, i.e., 100° K. or less, the heat energy (RT) of electrons excited by α-particles in the substrate is 8.5 meV or less, it is possible with this barrier to effectively prevent the noise electrons from flowing into the data line 72 or the memory cell charge accumulation portion 73. Since the interface 10 between the p-well 70 and the p-layer 80 is formed at a depth of about 0.5 μm from the Si surface and the range of α-particles is about 20 μm, only 1/40 of the noise electrons generated by α-particles are collected in the memory node 13 (in the case of vertical incidence). In other words, it is possible according to the present invention to reduce the amount of noise charges flowing into the memory node to 1/40. As a result, it is possible to reduce by a large margin the incidence of soft errors in the MOS RAM under low temperature conditions.

A fifth embodiment of the present invention will be described hereinunder with reference to FIG. 7. The fifth embodiment differs from the fourth embodiment in the contents of the barrier layer, that is, the p-layer 80, and the method of forming the barrier layer. In this embodiment, boron is implanted into the p-well 70 as in the conventional practice, and an element which has a relatively deep impurity level, for example, In, is implanted into the p-layer 80 which serves as a barrier. At this time, the In concentration is set so as to be one or more orders in magnitude higher than the concentration in the substrate or the well 70. As a result, at the boundary between the p-well 70 and the p-layer 80, a potential barrier of substantially $\frac{1}{2}$ ($E_A - E_A'$) ($E_A$: the acceptor level in the p-layer 80; $E_A'$: the acceptor level in the p-well 70) is formed as described above, so that it is possible to effectively prevent noise electrons from flowing into the data line 72 or the memory cell charge accumulation portion 73. The effects of this embodiment are similar to those in the case of the fourth embodiment.

Although in the above-described arrangement shown in FIG. 7 the surface region (the surface region facing the electrode 75) of the p-type semiconductor substrate is used as an information accumulation node, said surface region may be of the buried channel type so that a charge accumulation region is formed inside the semiconductor substrate.

Although in the foregoing embodiments the function and effects of the present invention have been described by way of one example in which an n+ impurity layer is employed to define a memory node, similar function and effects may, of course, be realized also in the case where a memory cell is formed using a p-channel transistor and a p+ impurity layer is employed to define a memory node.

According to the present invention, it is possible to provide a barrier layer which effectively prevents noise charges from flowing into the memory node even at 100° K. or less. It is therefore possible to greatly reduce the incidence of soft errors in low temperature operation MOS memories. As a result of application of the present invention to a MOS static RAM, it was found that the incidence of soft errors at 100° K. or less was reduced by two or more orders in magnitude.

What is claimed is:

1. A semiconductor device comprising:
   (1) a first semiconductor layer containing a first conductivity type which is formed in a semiconductor substrate;
   (2) a charge accumulation portion disposed in said first semiconductor layer to accumulate information charge of a memory cell; and
   (3) a barrier semiconductor layer formed in said first semiconductor layer under said charge accumulation portion,
   wherein said barrier semiconductor layer is defined by a semiconductor layer of the first conductivity type which is partially compensated by an impurity of a second conductivity type which is opposite to said first conductivity type,
   wherein said first semiconductor layer of said first conductivity type is formed in said semiconductor substrate of said second conductivity type, and
   wherein said carrier semiconductor layer has a contact with said semiconductor substrate within said first semiconductor layer.

2. A semiconductor device according to claim 1, wherein an impurity concentration of said first conductivity type is larger than that of said second conductivity type in said semiconductor layer of said first conductivity type of said barrier semiconductor layer, impurities of said first and second conductivity types cancelling each other but said semiconductor layer of said first conductivity type of said barrier semiconductor layer having an electrical characteristic corresponding to said first conductivity type after such cancellation.

3. A semiconductor device according to claim 2, wherein the operating temperature of said semiconductor device is 100° K. or less.

4. A semiconductor device according to claim 2, wherein the first semiconductor layer of said first conductivity type is a p-type well region which is formed in said semiconductor substrate of n-type, said barrier semiconductor layer being a p-type semiconductor layer which is partially compensated by an n-type impurity.

5. A semiconductor device according to claim 4, wherein said charge accumulation portion is an n-type semiconductor layer.

6. A semiconductor device according to claim 1, wherein the operating temperature of said semiconductor device is 100° K. or less.

7. A semiconductor device comprising:

(1) a first semiconductor layer containing a first impurity of a first conductivity type which is formed in a semiconductor substrate;
(2) a charge accumulation portion disposed in said first semiconductor layer to accumulate information charge of a memory cell; and
(3) a barrier semiconductor layer formed in the first semiconductor layer under said charge accumulation portion,
wherein said barrier semiconductor layer contains a second impurity of the same conductivity type as that of said first impurity which has a deep impurity level, said second impurity having a shallow impurity level.

8. A semiconductor device according to claim 5, wherein said first and second impurities are of p-type.

9. A semiconductor device according to claim 6, wherein the impurity concentration of said second impurity is higher than that of said first impurity.

10. A semiconductor device according to claim 7 wherein the operating temperature of said semiconductor device is 100° K. or less.

11. A semiconductor device comprising:
(1) a first semiconductor layer containing a first impurity of a first conductivity type which is formed in a semiconductor substrate;
(2) a charge accumulation portion disposed in said first semiconductor layer to accumulate information charge of a memory cell; and
(3) a barrier semiconductor layer formed in said first semiconductor layer under said charge accumulation portion,
wherein said barrier semiconductor layer contains a second impurity of the same conductivity type as that of said first impurity which has a shallow impurity level, said second impurity having a deep impurity level,
wherein said first semiconductor layer of said first conductivity type is formed in said semiconductor substrate of said second conductivity type, and
wherein said barrier semiconductor layer has a contact with said semiconductor substrate within said first semiconductor layer.

12. A semiconductor device according to claim 11, wherein said first and second impurities are of p-type.

13. A semiconductor device according to claim 11, wherein the operating temperature of said semiconductor device is 100° K. or less.

14. A semiconductor device according to claim 4, wherein the operating temperature of said semiconductor device is 100° K. or less.

15. A semiconductor device according to claim 5, wherein the operating temperature of said semiconductor device is 100° K. or less.

16. A semiconductor device according to claim 8, wherein the operating temperatures of said semiconductor device is 100° K. or less.

17. A semiconductor device according to claim 9, wherein the operating temperature of said semiconductor device is 100° K. or less.

18. A semiconductor device according to claim 12, wherein the operating temperature of said semiconductor device is 100° K. or less.

* * * * *